(12) United States Patent
Yu (10) Patent No.: US 12,040,316 B2
(45) Date of Patent: Jul. 16, 2024

(54) DISPLAY PANEL AND DISPLAY DEVICE

(71) Applicant: Shanghai Tianma Microelectronics Co., Ltd., Shanghai (CN)

(72) Inventor: Quanpeng Yu, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 404 days.

(21) Appl. No.: 17/546,498

(22) Filed: Dec. 9, 2021

(65) Prior Publication Data

US 2022/0102325 A1 Mar. 31, 2022

(30) Foreign Application Priority Data

Jul. 16, 2021 (CN) .......................... 202110807724.7

(51) Int. Cl.
| | |
|---|---|
| *H01L 33/50* | (2010.01) |
| *H01L 25/075* | (2006.01) |
| *H01L 33/38* | (2010.01) |
| *H01L 33/62* | (2010.01) |

(52) U.S. Cl.
CPC ........ *H01L 25/0753* (2013.01); *H01L 33/382* (2013.01); *H01L 33/62* (2013.01); *H01L 33/504* (2013.01)

(58) Field of Classification Search
CPC ... H01L 25/0753; H01L 33/382; H01L 33/62; H01L 33/504
See application file for complete search history.

(56) References Cited

U.S. PATENT DOCUMENTS

| | | | | |
|---|---|---|---|---|
| 2006/0267969 A1* | 11/2006 | Doi | ................... | G02F 1/133512 |
| | | | | 345/204 |
| 2022/0255030 A1* | 8/2022 | Yu | ........................ | H10K 50/858 |
| 2023/0112002 A1* | 4/2023 | Wang | ................ | H10K 59/8792 |
| | | | | 257/40 |

FOREIGN PATENT DOCUMENTS

| | | |
|---|---|---|
| CN | 111769109 A | 10/2020 |
| CN | 112786760 A | 5/2021 |

* cited by examiner

*Primary Examiner* — Anne M Hines
(74) *Attorney, Agent, or Firm* — KDW Firm PLLC (57) ABSTRACT

Provided are display panel and display device. Display panel includes first substrate, second substrate, bank layer on side of first substrate facing second substrate, color resistance layer on side of first substrate facing second substrate, and light-emitting elements. Bank layer includes bank structures defining bank openings. Color resistance layer includes color resistance modules spaced apart. Color resistance modules is disposed in correspondence to bank openings and include blue color resistance module. Light-emitting elements is disposed in correspondence to bank openings. Projection of light-emitting element on first substrate does not overlap projection of bank structure on first substrate. Bank structures include first bank structure and second bank structure. Blue color resistance module adjacent to at least one first bank structure. Width of the first bank structure is greater than width of the second bank structure. Bank structures designed with different widths facilitate mitigating the crosstalk of laterally-leaked light, enhancing display effect.

20 Claims, 7 Drawing Sheets

DISPLAY PANEL AND DISPLAY DEVICE

CROSS-REFERENCE TO RELATED APPLICATION(S)

This application claims priority to Chinese Patent Application No. 202110807724.7 filed Jul. 16, 2021, the disclosure of which is incorporated herein by reference in its entirety.

TECHNICAL FIELD

Embodiments of the present disclosure relate to the field of display technologies and, in particular, to a display panel and a display device.

BACKGROUND

With the progress and development of science and technology and the improvement of living standards, display panels have been applied to various electronic products and thus have been manufactured in large quantities. People hold increasingly higher requirements for the display performance of display panels.

In the existing manufacturing process of a display panel, how to improve the display effect of the display panel has become an urgent problem to be solved.

SUMMARY

Embodiments of the present disclosure provide a display panel and a display device to improve the display effect of a display panel.

Embodiments of the present disclosure provide a display panel. The display panel includes a first substrate, a second substrate, a bank layer, a color resistance layer, and light-emitting elements.

The first substrate and the second substrate are disposed opposite to each other.

The bank layer is disposed on a side of the first substrate facing the second substrate and includes a plurality of bank structures, and the plurality of bank structures define a plurality of bank openings.

The color resistance layer is disposed on a side of the first substrate facing the second substrate and includes a plurality of color resistance modules, and the plurality of color resistance modules are spaced apart. The plurality of color resistance modules are disposed in correspondence to the plurality of bank openings, and the plurality of color resistance modules include a blue color resistance module.

The plurality of light-emitting elements are disposed in correspondence to the plurality of bank openings. A projection of a light-emitting element on the first substrate does not overlap a projection of a bank structure on the first substrate.

The plurality of bank structures include a first bank structure and a second bank structure. In the direction parallel to the first substrate, the blue color resistance module is adjacent to at least one first bank structure. A width of the first bank structure is greater than a width of the second bank structure.

Based on a same inventive concept, embodiments of the present disclosure further provide a display device. The display device includes the preceding display panel.

BRIEF DESCRIPTION OF DRAWINGS

To illustrate the technical solutions in embodiments of the present disclosure or the technical solutions in the related art more clearly, drawings used in the description of the embodiments or the related art are described briefly hereinafter. Apparently, the drawings described hereinafter illustrate only part of embodiments of the present disclosure. For those skilled in the art, other structures and drawings may be extended and expanded based on basic concepts disclosed and suggested by various embodiments of the present disclosure. It is undoubtedly that these should be within the scope of claims of the present disclosure.

DETAILED DESCRIPTION

To illustrate the objects, technical solutions and advantages of embodiments of the present disclosure more clearly, the technical solutions in embodiments of the present disclosure will be described clearly and completely in conjunction with drawings in embodiments of the present disclosure. Apparently, the embodiments described are part, not all, of embodiments of the present disclosure. All other embodiments acquired by those skilled in the art based on the basic concepts disclosed and suggested by embodiments of the present disclosure are within the scope of the present disclosure.

Figure 1:
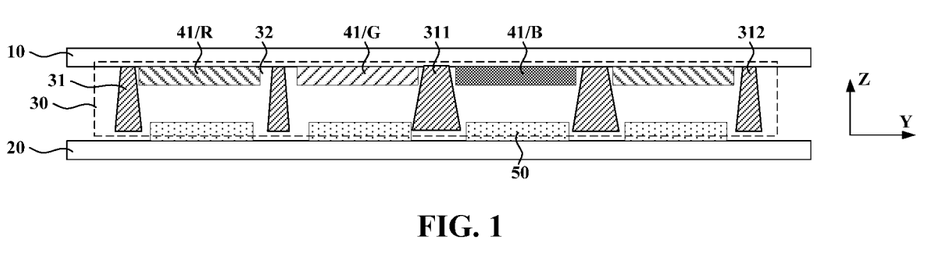
FIG. 1 is a schematic diagram of a display panel according to an embodiment of the present disclosure.
Figure 2:
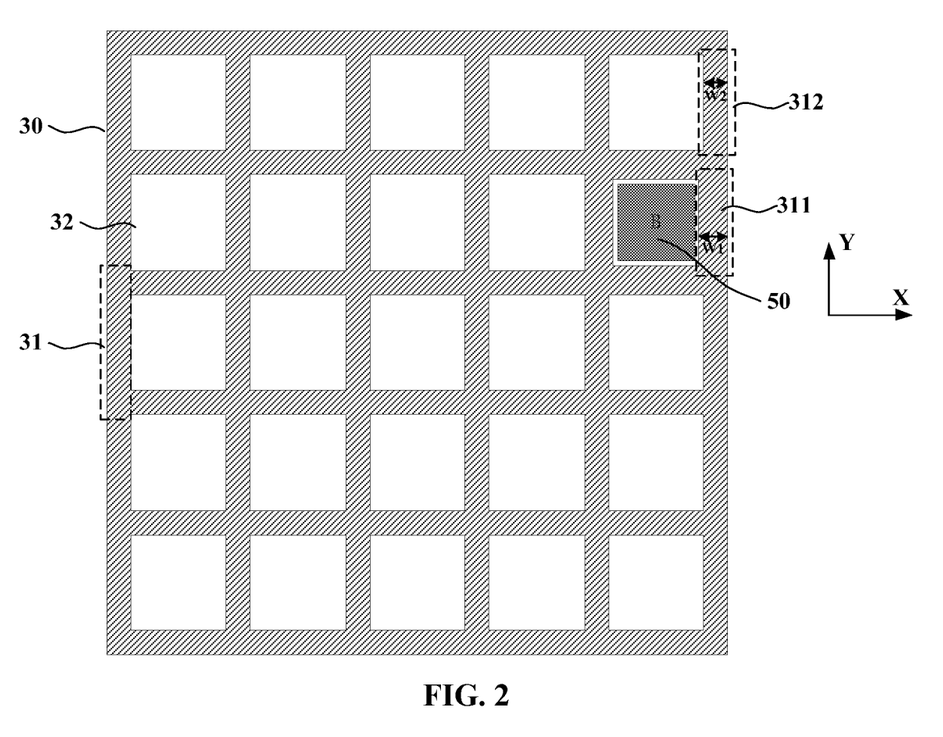
FIG. 2 is a top view of a bank layer of the display panel according to an embodiment of the present disclosure.

Referring to FIG. 1, FIG. 1 is a schematic diagram of a display panel according to an embodiment of the present disclosure. Referring to FIG. 2, FIG. 2 is a top view of a bank layer of the display panel according to an embodiment of the present disclosure. As is shown, the display panel provided by this embodiment includes a first substrate 10, a second substrate 20, a bank layer 30, a color resistance layer, and light-emitting elements 50. The first substrate 10 and the second substrate 20 are disposed opposite to each other. The bank layer 30 is disposed on a side of the first substrate 10 facing the second substrate 20 and includes a plurality of bank structures 31, and the plurality of bank structures 31 define a plurality of bank openings 32. The color resistance layer is disposed on a side of the first substrate 10 facing the second substrate 20 and includes a plurality of color resistance modules 41 that are spaced apart. The color resistance modules 41 is disposed in correspondence to the bank openings 32 and include a blue color resistance module B. The light-emitting elements 50 are disposed in correspondence to the bank openings 32. A projection of a light-emitting element 50 on the first substrate 10 does not overlap a projection of a bank structure 31 on the first substrate 10. The bank structures 31 include a first bank structure 311 and a second bank structure 312. In a plane X-Y parallel to the first substrate 10, the blue color resistance module B is adjacent to at least one first bank structure 311. A width W1 of the first bank structure 311 is greater than a width W2 of the second bank structure 312.

In this embodiment, the display panel includes the first substrate 10 and the second substrate 20 disposed opposite to each other; the plane in which the first substrate 10 is located is the plane X-Y; and the direction perpendicular to the first substrate 10 is a Z-direction. In an embodiment, the display panel is a micro-light-emitting diode display panel or a display panel of another type. In this case, the first substrate 10 in the display panel may be a color filter substrate and the second substrate 20 may be an array substrate.

It should be understood that the array substrate includes a substrate, array metal layers disposed on the substrate, and interlayer insulating layers disposed between the array metal layers. The array metal layers include at least a gate metal layer and a source-and-drain metal layer so as to form a pixel driving circuit array including elements like transistors. The pixel driving circuit array includes a plurality of pixel driving circuits that are disposed in correspondence to the light-emitting elements. A pixel driving circuit is configured to drive a corresponding light-emitting element to emit light. The color filter substrate includes a transparent substrate and structures such as a plurality of color resistance modules that are spaced apart on the transparent substrate. In an embodiment, the display panel may be a rigid display panel or a flexible display panel. In a further embodiment, the display panel may be a micro-light-emitting diode display panel or a quantum dot display panel. However, the display panel in embodiments of the present disclosure is not limited thereto.

Figure 3:
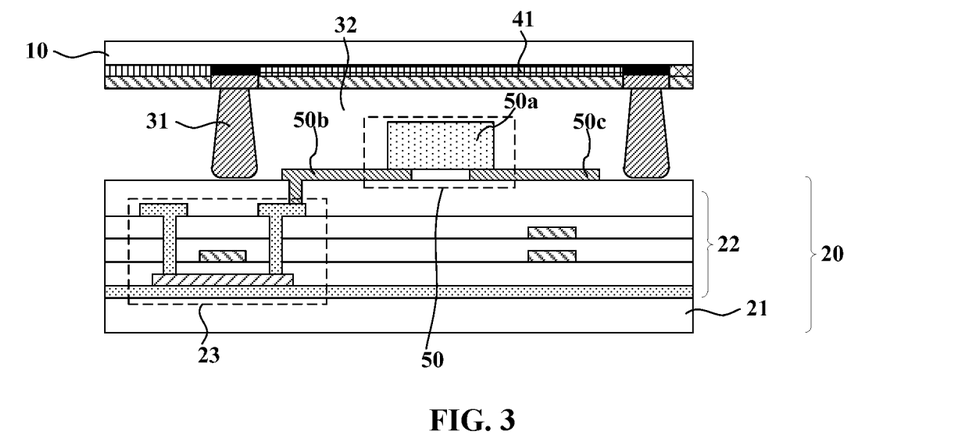
FIG. 3 is a schematic diagram of a display panel according to another embodiment of the present disclosure.

Referring to FIG. 3, FIG. 3 is a schematic diagram of a display panel according to another embodiment of the present disclosure. As shown in FIG. 3, optionally, the second substrate 20 includes a substrate 21 and array layers 22 that are disposed and stacked sequentially. The second substrate 20 is further provided with a light-emitting element layer. The substrate 21 is a flexible substrate or a rigid substrate. The array layers 22 include array metal layers and interlayer insulating layers. The array layers 22 include at least a gate metal layer and a source-and-drain metal layer. The gate metal layer and the source-and-drain metal layer form a pixel driving circuit array including structures like transistors. The pixel driving circuit array includes a plurality of pixel driving circuits 23. The light-emitting element layer includes a plurality of light-emitting elements 50 of one or more colors. One light-emitting element 50 in the light-emitting element layer is electrically connected to one corresponding pixel driving circuit 23 in the array layers 22. The pixel driving circuit 23 drives the light-emitting element 50 to emit light.

In an embodiment, the light-emitting elements 50 are micro-diode light-emitting elements. In an embodiment, the light-emitting element 50 includes a micro-light-emitting diode 50a, a first electrode 50b, and a second electrode 50c. The first electrode 50b and the second electrode 50c are insulated and spaced apart from each other, and each arranged in contact with the micro-light-emitting diode 50a. The light-emitting principle of the light-emitting element 50 is that an electrical signal is applied to the first electrode 50b and the second electrode 50c so as to energize the micro-light-emitting diode 50a. Then the micro-light-emitting diode 50a is electroluminescent. In an embodiment, the first electrode 50b and the second electrode 50c are disposed on a same side of the micro-light-emitting diode 50a. In another embodiment, the first electrode and the second electrode are disposed on different sides of the micro-light-emitting diode. It should be noted that FIG. 3 only illustrates the layer structure of the region in which one light-emitting element 50 is located as an example. In an embodiment, the light-emitting elements 50 are configured to emit blue light.

In this embodiment, the bank layer 30 is disposed on a side of the first substrate 10 facing the second substrate 20 and the bank layer 30 includes a plurality of bank structures 31. As shown in FIG. 2, the bank structures 31 communicate with each other to define a plurality of bank openings 32. The bank openings 32 are disposed in a one-to-one correspondence to the light-emitting elements 50. The bank structures 31 are disposed between adjacent light-emitting elements 50. In an embodiment, the bank structures 31 are disposed around the light-emitting elements 50 so that light-emitting electrodes of two adjacent light-emitting elements 50 are insulated from each other. Moreover, light of two adjacent light-emitting elements 50 is shielded to avoid lateral light leakage. It should be understood that a bank structure 31 may be configured to insulate adjacent light-emitting elements 50, avoiding crosstalk caused by lateral light leakage between two light-emitting elements 50. Taking that the shape of a bank opening 32 is quadrilateral as an example, a quadrilateral region defined by an end-to-end connection of four bank structures 31 is a bank opening 32. It should be understood that a position of the light-emitting element 50 is defined by the bank openings 32. In an embodiment, the light-emitting element 50 is disposed in a bank opening 32. That is, a projection of a light-emitting element 50 on the first substrate 10 does not overlap a projection of a bank structure 31 on the first substrate 10.

The color resistance layer is disposed on a side of the first substrate 10 facing the second substrate 20. The color resistance layer includes a plurality of color resistance modules 41 that are spaced apart. The color resistance modules 41 are disposed in correspondence to the bank openings 32 and include color resistance modules of different colors, for example, a red color resistance module R, a green color resistance module G, and the blue color resistance module B. It should be understood that when the light-emitting elements 50 are light-emitting elements of a same color, light of a same color emitted from the light-emitting elements 50 are converted into light of different colors after passing through color resistance modules of different colors. In this case, a normal display is implemented.

In this embodiment, the bank structures 31 in the bank layer 30 include a first bank structure 311 and a second bank structure 312; in the plane X-Y parallel to the first substrate 10, the blue color resistance module B is adjacent to at least one first bank structure 311; the width W1 of a first bank structure 311 is greater than the width W2 of a second bank structure 312; the color resistance modules 41 are disposed in correspondence to the light-emitting elements 50 and then the bank structures 31 are disposed between adjacent color resistance modules 41; at least one bank structure 31 disposed at an periphery of the blue color resistance module B is a first bank structure 311; and the width W1 of a first bank structure 311 is greater than the width W2 of a second bank structure 312.

Herein, a dimension of a bank structure 31 in a width direction is the width of the bank structure 31. The width direction of the bank structure 31 is parallel to the plane X-Y in which the first substrate 10 is located. Moreover, the width direction of the bank structure 31 is perpendicular to an extension direction of the bank structure 31. It should be understood that extension directions of the bank structures 31 in the bank layer 30 are not the same. Accordingly, the width directions of different bank structures 31 in the bank layer 30 may be different. As shown in FIG. 2, the extension direction of the marked first bank structure 311 and the extension direction of the marked second bank structure 312 are the same and are each in a Y-direction. The width direction of a marked first bank structure 311 and the width direction of a marked second bank structure 312 are both in a X-direction. However, there are still width directions of part of the bank structures 31 same as the Y-direction.

It should be noted that for a quantum dot display panel, the light-emitting elements usually all emit blue light, and the color resistance modules include resistors of different colors. Accordingly, after passing through a color resistance module, light emitted from the light-emitting elements converts into light of a color corresponding to this color resistance module. It should be understood that due to processing limitations, a gap may be provided between a bank structure and the second substrate. In this case, lateral light leakage may occur between adjacent light-emitting elements. The light emitted from a light-emitting element passes laterally through the gap between a bank structure and the second substrate and then enters an adjacent bank opening, thus affecting the luminance of the adjacent light-emitting element.

In an embodiment, the color resistance modules 41 further include a red color resistance module R and a green color resistance module G. In the direction parallel to the first substrate 10, a second bank structure 312 is disposed between a red color resistance module R and a green color resistance module G.

In this embodiment, the blue color resistance module B is adjacent to at least one first bank structure 311; the width W1 of a first bank structure 311 is greater than the width W2 of a second bank structure 312; and the width of the first bank structure 311 adjacent to the blue color resistance module B is relatively great. Accordingly, the light from an adjacent light-emitting element is difficult to pass through a gap between the first bank structure 311 and the second substrate 20 to enter a bank opening 32 corresponding to the blue color resistance module B. This prevents lateral light leakage from affecting the display of a region in which the blue color resistance module B is located, weakens the crosstalk of light from the adjacent light-emitting element, and enhances the display effect.

In embodiments of the present disclosure, the plurality of color resistance modules are disposed in correspondence to the plurality of bank openings and include a blue color resistance module; the plurality of bank structures include a first bank structure and a second bank structure; in the direction parallel to the first substrate, the blue color resistance module is adjacent to at least one first bank structure; and a width of the first bank structure is greater than a width of the second bank structure. The relatively great width of the first bank structure makes the light emitted from an adjacent light-emitting element difficult to pass through a gap between the first bank structure and the second substrate and thus difficult to enter a bank opening corresponding to the blue color resistance module. This weakens the transmission and crosstalk of lateral light from the adjacent light-emitting element and enhances the display effect.

Figure 4:
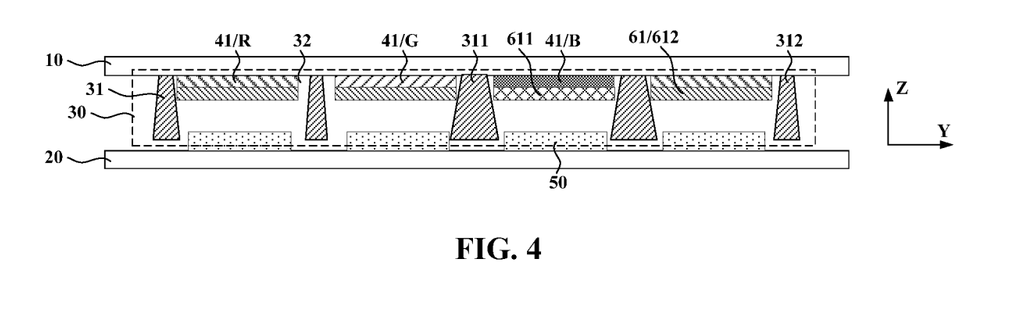
FIG. 4 is a schematic diagram of a display panel according to another embodiment of the present disclosure.

Referring to FIG. 4, FIG. 4 is a schematic diagram of a display panel according to another embodiment of the present disclosure. As shown in FIG. 4, in an embodiment, the display panel further includes a first functional layer disposed on a side of the color resistance layer facing the second substrate 20; the first functional layer includes a plurality of functional modules 61 that are spaced apart and the plurality of functional modules 61 are disposed in correspondence to the bank openings 32; the functional module 61 is made of scattered ions; and in the direction parallel to the first substrate 10, the bank structure 31 is disposed in a gap between two adjacent functional modules 61. In an embodiment, the functional modules 61 include a first functional module 611 and a second functional module 612; the color resistance modules 41 further include a red color resistance module R and a green color resistance module G; the blue color resistance module B is disposed in correspondence to the first functional module 611; the second functional module 612 is disposed in correspondence to the red color resistance module R or the green color resistance module G; and the second functional module 612 is further made of quantum dots.

In this embodiment, the functional module 61 corresponding to the blue color resistance module B is a first functional module 611. Since the first functional module 611 is not made of quantum dots, light emitted from the corresponding light-emitting element 50 are not subject to a quantum dot conversion when passing through the first functional module 611. The functional module 61 corresponding to a red color resistance module R is a second functional module 612. Since the second functional module 612 is further made of quantum dots, light emitted from the corresponding light-emitting element 50 is subject to a quantum dot conversion when passing through the second functional module 612, and is emitted from the red color resistance module R. The functional module 61 corresponding to a green color resistance module G is the second functional module 612. Since the second functional module 612 is made of quantum dots, light emitted from the corresponding light-emitting element 50 is subject to a quantum dot conversion when passing through the second functional module 612, and is emitted from the green color resistance module G.

It should be noted that the process of a quantum dot conversion weakens light. Thus, it can be seen that light emitted from a light-emitting element 50 is not subject to a quantum dot conversion when passing through a first functional module 611. Therefore, the laterally-leaked light is not weakened when passing through the first functional module 611. However, light emitted from a light-emitting element 50 is subject to a quantum dot conversion when passing through the second functional module 612. Therefore, the second functional module 612 weakens light, making the laterally-leaked light with a relatively low light flux weaker.

As described, a light flux of the laterally-leaked light is relatively low. The laterally-leaked light is further weakened through a quantum dot conversion. Accordingly, the laterally-leaked light is almost eliminated after entering the second functional module 612 and cannot be emitted from the second functional module 612. However, the laterally-leaked light is not weakened when entering the first functional module 611 and is easily emitted from the first functional module 611. It can thus be seen that in the case of lateral light leakage, the laterally-leaked light has a relatively great effect on light emission of the region corresponding to the blue color resistance module B, but has a relatively small effect on light emission of the region corresponding to a red color resistance module or a green color resistance module.

Based on above, the width of the first bank structure 311 adjacent to the blue color resistance module B is greater than the width of another bank structure 311, adding the difficulty of the laterally-leaked light passing through the first bank structure 311. This makes the laterally-leaked light difficult to pass through the first bank structure 311 and difficult to enter a bank opening 32 corresponding to the blue color resistance module B, thus weakening the laterally-leaked light and enhancing the display effect. It should be understood that the thickness design of the bank structures helps avoid lateral light leakage between adjacent light-emitting elements.

In an embodiment, in the Z-direction perpendicular to the first substrate 10, the bank structure 31 includes a first end facing the first substrate 10 and a second end facing the second substrate 20. In the direction parallel to the first substrate 10, a width of a first end of the first bank structure 311 is greater than a width of a first end of the second bank structure 312, and a width of a second end of a first bank structure 311 is greater than a width of a second end of a second bank structure 312.

In this embodiment, the first end of the bank structure 31 faces the first substrate 10; the second end of the bank structure 31 faces the second substrate 20; and the bank layer is disposed on a side of the first substrate 10 facing the second substrate 20. Due to the manufacturing process, a gap may exist between the second end of the bank structure 31 and the second substrate 20. Moreover, the width of the second end of a first bank structure 311 is greater than the width of the second end of a second bank structure 312. The arrangement in which the width of the second end of a first bank structure 311 is increased, adds the difficulty of lateral light from an adjacent light-emitting element 50 to enter a bank opening 32 corresponding to the blue color resistance module B, weakens the effect of the lateral light leakage of the adjacent light-emitting element 50 on the blue color resistance module B, and enhances display effect.

In other embodiments, when a gap is provided between the first end of a bank structure and the first substrate, the arrangement in which the width of the first end of a first lateral bank structure is greater than the width of the first end of a second bank structure, may prevent light from an adjacent light-emitting element from entering a bank opening corresponding to the blue color resistance module, which weakens the lateral light leakage of the adjacent light-emitting element and enhances the display effect.

Figure 5:
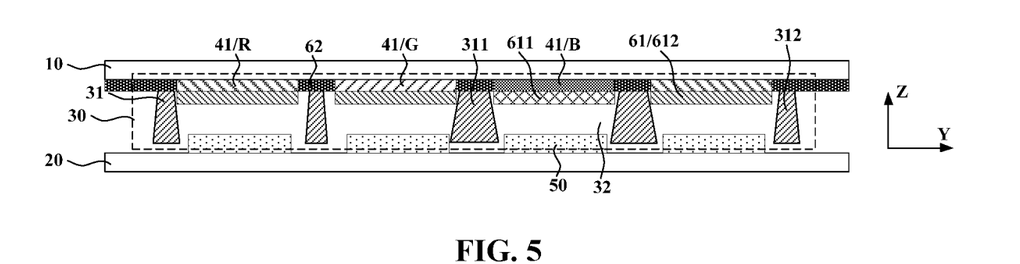
FIG. 5 is a schematic diagram of a display panel according to another embodiment of the present disclosure.

Referring to FIG. 5, FIG. 5 is a schematic diagram of a display panel according to another embodiment of the present disclosure. As shown in FIG. 5, in an embodiment, the display panel further includes a plurality of light-shielding structures 62, and the light-shielding structure 62 is disposed between the first substrate 10 and the bank structures 31. The light-shielding structures 62 define a plurality of light-transmitting openings corresponding to the bank openings 32. A projection of a light-shielding structure 62 on the first substrate 10 overlaps at least part of the projection of the bank structure 32 on the first substrate 10. In this embodiment, the light-shielding structures 62 may be black matrices disposed on a side of the first substrate 10 facing the second substrate 20. The black matrices include a plurality of light-transmitting openings corresponding to light-emitting elements 50.

Figure 6:
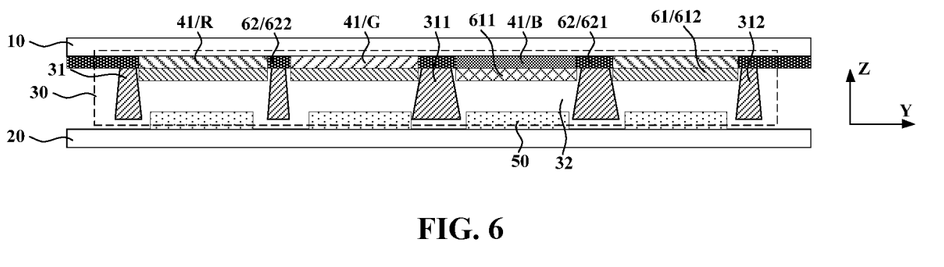
FIG. 6 is a schematic diagram of a display panel according to another embodiment of the present disclosure.

Referring to FIG. 6, FIG. 6 is a schematic diagram of a display panel according to another embodiment of the present disclosure. As shown in FIG. 6, in an embodiment, the light-shielding structures 62 include a first light-shielding structure 621 and a second light-shielding structure 622. In the Z-direction perpendicular to the first substrate 10, a first light-shielding structure 621 overlaps at least part of a first bank structure 311, and a second light-shielding structure 622 overlaps at least part of a second bank structure 312. In the direction parallel to the first substrate 10, a width of a first light-shielding structure 621 is greater than or equal to a width of a second light-shielding structure 622. In an embodiment, a projection of a first light-shielding structure 621 on the first substrate 10 overlaps the projection of a first bank structure 311 on the first substrate 10; and a projection of a second light-shielding structure 622 on the first substrate 10 overlaps the projection of a second bank structure 312 on the first substrate 10. It should be understood that the width direction of a light-shielding structure is the same as the width direction of a corresponding bank structure. Width directions and width dimensions would not be repeated in detail herein.

In this embodiment, the light-shielding structure 62 disposed between the first substrate 10 and the first bank structure 311 is a first light-shielding structure 621, and the light-shielding structure 62 disposed between the first substrate 10 and the second bank structure 312 is a second light-shielding structure 622. It is known that the width of the first bank structure 311 needs to be greater than the width of the second bank structure 312. In this case, the arrangement in which the width of a first light-shielding structure 621 corresponding to a first bank structure 311 is greater than or equal to the width of a second light-shielding structure 622 corresponding to a second bank structure 312, facilitates the arrangement in which the first bank structure 311 has a relatively great width on a side of a first light-shielding structure 621 facing the second substrate 20, avoiding the lateral light leakage.

Figure 7:
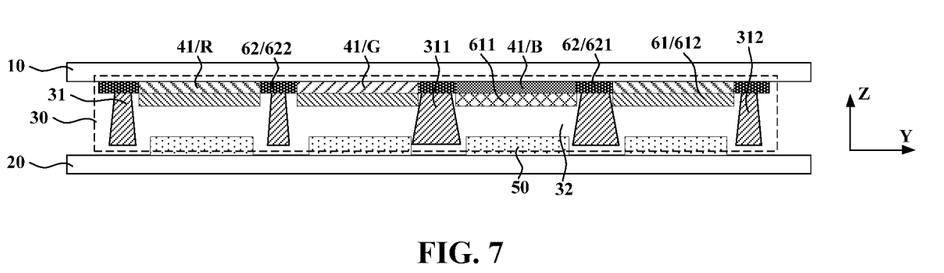
FIG. 7 is a schematic diagram of a display panel according to another embodiment of the present disclosure.

Referring to FIG. 7, FIG. 7 is a schematic diagram of a display panel according to another embodiment of the present disclosure. The difference from FIG. 6 lies in that in the direction parallel to the first substrate 10, the width of a first light-shielding structure 621 is equal to the width of a second light-shielding structure 622. It should be understood that the width direction of a light-shielding structure is the same as the width direction of a corresponding bank structure. Width directions and the width dimensions are not repeated in detail herein.

As described, the arrangement in which the width of the first bank structure 311 is greater than the width of the second bank structure 312 may avoid lateral light leakage. On this basis, the arrangement in which the width of a first light-shielding structure 621 on the bank layer 30 is the same as the width of a second light-shielding structure 622 on the bank layer 30, does not increase the width of the first light-shielding structure 621 corresponding to the first bank structure 311 with relatively great width. In this case, lateral light leakage is avoided; the resolution of the display panel is not affected; and light-emitting efficiency of a bank opening corresponding to a blue color resistance module is not affected.

Figure 8:
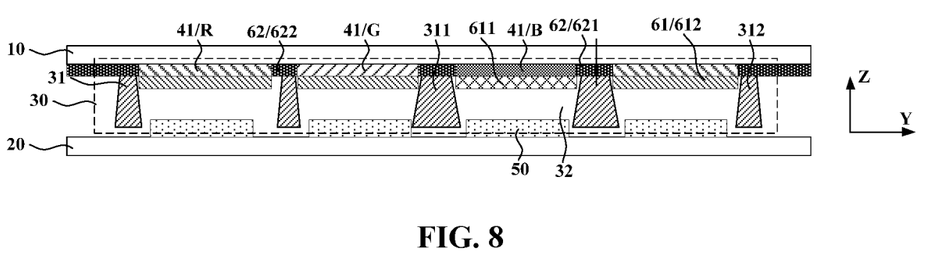
FIG. 8 is a schematic diagram of a display panel according to another embodiment of the present disclosure.
Figure 9:
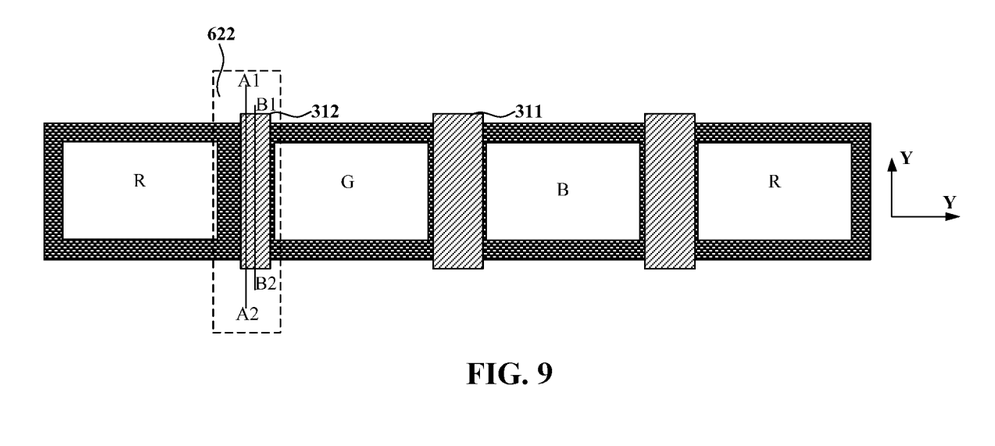
FIG. 9 is a top view illustrating part of a display panel according to an embodiment of the present disclosure.

Referring to FIG. 8, FIG. 8 is a schematic diagram of a display panel according to another embodiment of the present disclosure. Referring to FIG. 9, FIG. 9 is a top view illustrating part of a display panel according to an embodiment of the present disclosure. As shown in FIGS. 8 and 9, in an embodiment, in the extension direction of the bank structures 31, a second light-shielding structure 622 is symmetrical with respect to a first symmetrical benchmark A1-A2, and a second bank structure 312 is symmetrical with respect to a second symmetrical benchmark B1-B2. In the direction parallel to the first substrate 10, a preset distance is provided between the first symmetrical benchmark A1-A2 and the second symmetrical benchmark B1-B2.

In this embodiment, the second light-shielding structure 622 is disposed between the first substrate 10 and the second bank structure 312. A center of the second light-shielding structure 622 is not coincident with a center of the corresponding second bank structure 312. In an embodiment, a second light-shielding structure 622 is symmetrical with respect to a first symmetrical benchmark A1-A2; a second bank structure 312 is symmetrical with respect to a second symmetrical benchmark B1-B2; and a symmetrical benchmark of one of the tow is not coincident with that of the other of the two. It should be understood that the symmetrical benchmarks of the two have the same direction which is, for example, parallel to the extension direction of the bank structures.

In an embodiment, the color resistance modules 41 further include a red color resistance module R and a green color resistance module G. In the direction parallel to the first substrate 10, a second bank structure 312 is disposed between a red color resistance module R and a green color resistance module G. The second symmetrical benchmark B1-B2 of the second bank structure 312 is farther away from the red color resistance module R than the first symmetrical benchmark A1-A2 of the second light-shielding structure 622 corresponding to the second bank structure 312.

In this embodiment, the second symmetrical benchmark B1-B2 of a second bank structure 312 is farther away from an adjacent red color resistance module R and is closer to an adjacent green color resistance module G. In this case, a bank opening 32 corresponding to a red color resistance module R has a relatively large space, thus enabling a light-emitting element in the bank opening 32 to be formed into a large size to enhance display effect. Moreover, a larger size of a light-emitting element in the bank opening 32 indicates a lower power, thus reducing power consumption.

It should be noted that when the second symmetrical benchmark B1-B2 of the second bank structure 312 is farther away from the red color resistance module R and is closer to an adjacent light-emitting element, an increase in the size of a light-emitting element corresponding to the red color resistance module R makes a light-emitting center of light-emitting element drift from a center of the light-transmitting opening. On this basis, the second functional module 612 is disposed in correspondence to the red color resistance module R. The second functional module 612 is made of scattered ions and quantum dots. In this case, when light emitted from a light-emitting element with a relatively large size corresponding to a red color resistance module R passes through the second functional module 612, the scattered ions therein mitigates the drift of the light-emitting center of this light-emitting element, enhancing display effect.

Referring to FIG. 3, in an embodiment, a light-emitting element 50 includes a first electrode 50b, a second electrode 50c, and a light-emitting structure body 50a electrically connected to the first electrode 50b and the second electrode 50c. In the direction perpendicular to the first substrate 10, the light-emitting structure body 50a includes a first surface facing the first substrate 10. In the direction parallel to the first substrate 10, an area of the first surface of a light-emitting structure body 50a corresponding to a red color resistance module is larger than an area of a first surface of a light-emitting structure body 50a corresponding to a green color resistance module. In another embodiment, an area of the first surface of a light-emitting structure body 50a corresponding to a red color resistance module is larger than an area of the first surface of a light-emitting structure body 50a corresponding to a blue color resistance module.

In this embodiment, in a light-emitting element 50 corresponding to a red color-resistance module R, the light-emitting structure body 50a has a relatively large surface area on a side facing the first substrate 10, thus enhancing the display effect. Moreover, a larger area of the first surface of the light-emitting structure body 50a indicates a lower light-emitting power, thus reducing power consumption.

Figure 10:
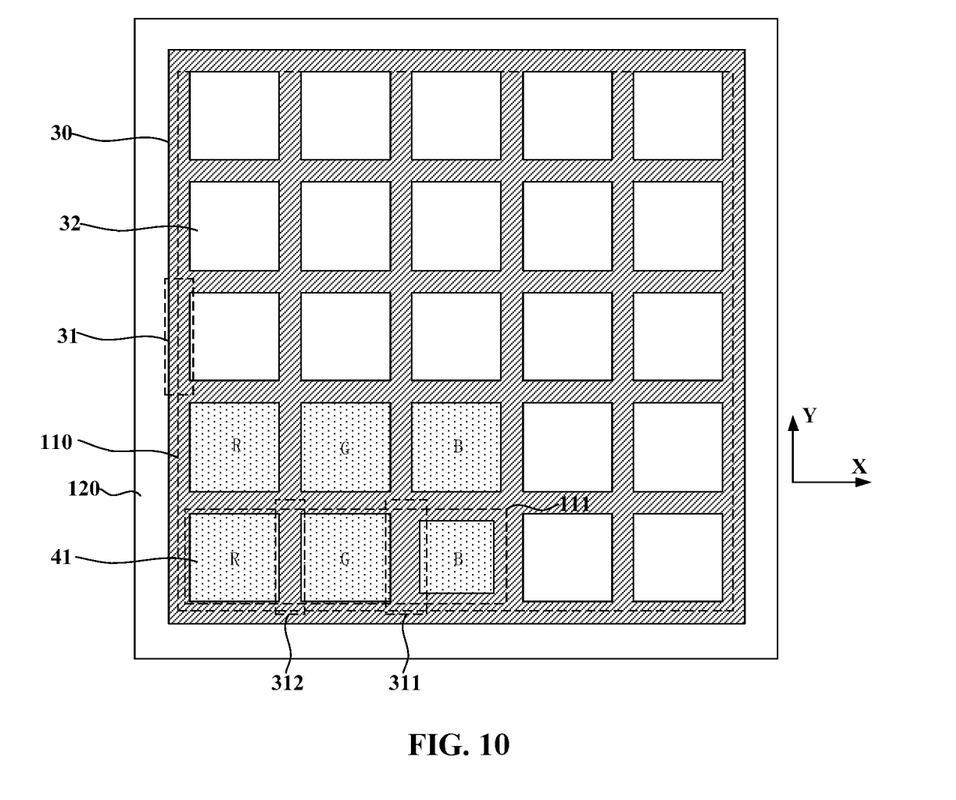
FIG. 10 is a schematic diagram of a display panel according to another embodiment of the present disclosure.

Referring to FIG. 10, FIG. 10 is a schematic diagram of a display panel according to another embodiment of the present disclosure. As shown in FIG. 10, in an embodiment, the display panel includes a display region 110 and a non-display region 120; the display region 110 includes a plurality of first display units 111 disposed in an array. A first display unit 111 includes three light-emitting elements disposed sequentially in a first direction; and the three light-emitting elements each is disposed in correspondence to a color resistance module 41 of a different color. In an embodiment, the first direction is the X-direction.

In this embodiment, light-emitting elements 50 are configured to emit blue light. In this case, the three light-emitting elements of each first display unit 111 each is disposed in correspondence to a color resistance module 41 of a different color. In an embodiment, the colors of the three color resistance modules 41 corresponding to one first display unit 111 are in an order of R, G, and B. However, this is not limited in the present disclosure. For example, the colors of the three color resistance modules corresponding to one first display unit are not in the order of R, G, and B, but may be in an order of G, R, and B or in any other order. In another embodiment, one first display unit includes four light-emitting elements. The colors of the four color resistance modules corresponding to the four light-emitting elements are R, G, B, and W respectively, or R, G, B, and Y respectively. The order of the colors of the color resistance modules is not limited herein.

It should be understood that as shown in FIG. 10, in an embodiment, a plurality of bank structures 31 adjacent to the blue color resistance module B are each a first bank structure 311. In another embodiment, among the bank structures adjacent to the blue color resistance module, at least one bank structure is a first bank structure and at least one bank structure is a second bank structure. That is, a first bank structure 311 is adjacent to the blue color resistance module B. A second bank structure 312 may be disposed between a red color resistance module R and a green color resistance module G. In another embodiment, a second bank structure may also be adjacent to the blue color resistance module. The arrangement in which a first bank structure 311 with a relatively great width is adjacent to the blue color resistance module B, facilitates blocking lateral light leakage, weakening lateral light emitted from an adjacent light-emitting element and transmitted in a bank opening 32 in which the blue color resistance module B is located, and enhancing display effect.

Figure 11:
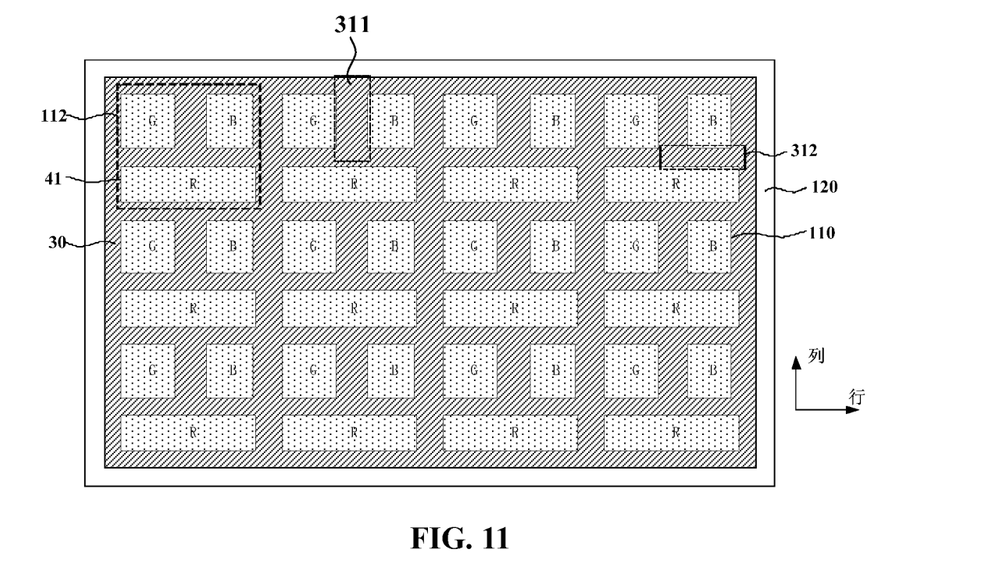
FIG. 11 is a schematic diagram of a display panel according to another embodiment of the present disclosure.

Referring to FIG. 11, FIG. 11 is a schematic diagram of a display panel according to another embodiment of the present disclosure. As shown in FIG. 11, in an embodiment, the display panel includes a display region 110 and a non-display region 120; the display region 110 includes a plurality of second display units 112 disposed in an array; a second display unit 112 includes three light-emitting elements, each of which is disposed in correspondence to a color resistance modules 41 of a different color; and in the second display unit 112, two light-emitting elements are disposed in the same row, and the remaining one light-emitting element is disposed in an adjacent row.

In this embodiment, light-emitting elements 50 are configured to emit blue light. In this case, the three light-emitting elements of each second display unit 112 each is disposed in correspondence to a color resistance module 41 of a different color. In an embodiment, the three light-emitting elements of a second display unit 112 are disposed in a shape of inverted triangle. In this case, corresponding three color resistance modules 41 are disposed in a shape of inverted triangle. However, the present disclosure is not limited thereto. In other embodiments, the pixel arrangement of the display panel may be different, which is not illustrated in detail herein. In an embodiment, the color resistance modules 41 corresponding to the two light-emitting elements of a second display unit 112 that are disposed in a same row are a green color resistance module G and a blue color resistance module B, and the color resistance module 41 corresponding to light-emitting element in an adjacent row is a red color resistance module R. In other embodiments, the color resistance modules corresponding to the two light-emitting elements in the same row are a red color resistance module R and another color resistance module such as a green color resistance module G; and a color resistance module corresponding to a light-emitting element in an adjacent row is a remaining color resistance module such as a blue color resistance module B. The present disclosure is not limited thereto.

It should be understood that as shown in FIG. 11, in an embodiment, among the bank structures adjacent to the blue color resistance module B, at least one bank structure is a first bank structure 311 and at least one bank structure is a second bank structure 312. In other embodiments, the bank structures adjacent to the blue color resistance module are each a first bank structure. That is, a first bank structure 311 is adjacent to the blue color resistance module B. A second bank structure 312 may be disposed between a red color resistance module R and a green color resistance module G. A second bank structure 312 may also be adjacent to the blue color resistance module B. The arrangement in which a first bank structure 311 with a relatively great width is adjacent to the blue color resistance module B, helps block lateral light leakage, and weaken lateral light emitted from an adjacent light-emitting element and transmitted in a bank opening 32 in which the blue color resistance module B is located, mitigating the crosstalk caused by light leakage, and enhancing display effect.

As an example, on the basis of the preceding technical solutions, at least part of a first bank structure is made of a light-absorbing material. When entering a first bank structure, laterally-leaked light are absorbed by the first bank structure and are weakened. When entering the gap between the first bank structure and the second substrate, the laterally-leaked light are limited by the width of the first bank structure and fail to be transmitted. Accordingly, when the laterally-leaked light from an adjacent light-emitting element pass through the first bank structure, due to the relatively great width of the first bank structure, most of the laterally-leaked light fail to pass through the gap between the first bank structure and the second substrate. This weakens the laterally-leaked light. Moreover, when transmitted in the gap between the first bank structure and the second substrate, the laterally-leaked light are easily absorbed by the first bank structure and thus is further weakened. Finally, only extremely weak light or almost no laterally-leaked light enter a bank opening corresponding to a blue color resistance module, thus enhancing the display effect.

Figure 12:
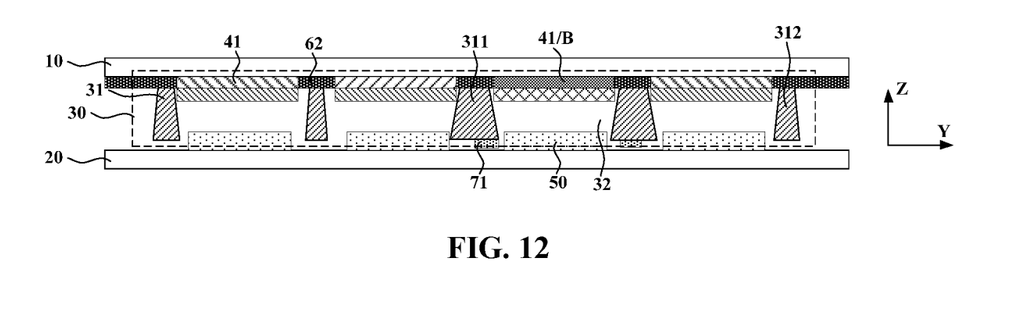
FIG. 12 is a schematic diagram of a display panel according to another embodiment of the present disclosure.

Referring to FIG. 12, FIG. 12 is a schematic diagram of a display panel according to another embodiment of the present disclosure. In an embodiment, the bank structure 31 includes a second end facing the second substrate 20; the display panel further includes at least one light-absorbing module 71; and the light-absorbing module 71 covers at least the second end of the first bank structure 311.

In this embodiment, the display panel further includes at least one light-absorbing module 71. A light-absorbing module 71 covers at least the second end of the first bank structure 311. In an embodiment, light-absorbing module 71 is disposed in the gap between the first bank structure 311 and the second substrate 20 and attached to the second end of the first bank structure 311. A light-absorbing module 71 is made of a light-absorbing material for absorbing light. After the laterally-leaked light from an adjacent light-emitting element enters the gap between the first bank structure 311 and the second substrate 20, the relatively great width of the first bank structure 311 limits the transmission of light and weakens light. Moreover, the light-absorbing module 71 absorbs light in the gap and further weakens light. Accordingly, due to the increasing transmission distance of light and the arrangement of the at least one light-absorbing structure, laterally-leaked light are weakened greatly in the gap between the first bank structure 311 and the second substrate 20. Almost no laterally-leaked light are able to pass through the gap between the first bank structure 311 and the second substrate 20 to enter a bank opening 32 corresponding to the blue color resistance module B. This reduces the crosstalk of lateral light leakage and enhances the display effect.

Figure 13:
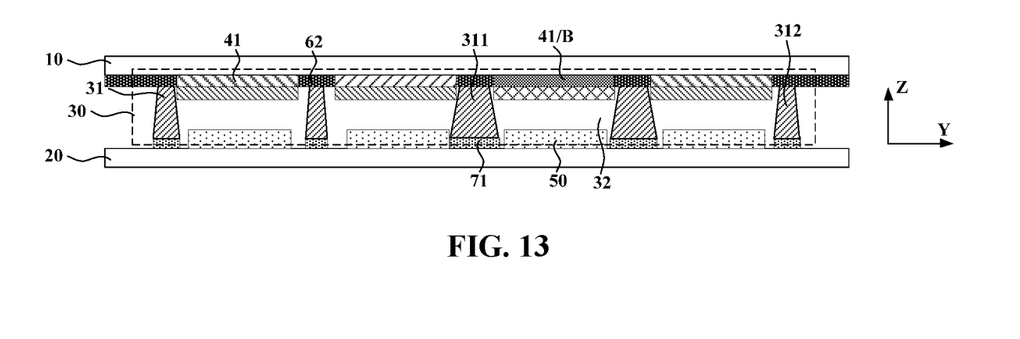
FIG. 13 is a schematic diagram of a display panel according to another embodiment of the present disclosure.

Referring to FIG. 13, FIG. 13 is a schematic diagram of a display panel according to another embodiment of the present disclosure. As shown in FIG. 13, the projection of a light-absorbing module 71 on the first substrate 10 covers the projection of the bank structure 31 on the first substrate 10.

In this embodiment, each gap between the bank structure 31 and the second substrate 20 is provided with a light-absorbing module 71. The light-absorbing module 71 is made of a light-absorbing material for absorbing light. When the laterally-leaked light from any light-emitting element enter a gap between the bank structure 31 and the second substrate 20, a light-absorbing module 71 absorbs incident light to weaken light. In this case, the laterally-leaked light are weakened greatly in the gap between the bank structure 31 and the second substrate 20. Almost no laterally-leaked light are able to pass through a gap between the bank structure 31 and the second substrate 20 and then to enter an adjacent bank opening. This reduces the crosstalk of lateral light leakage and enhances the display effect.

Figure 14:
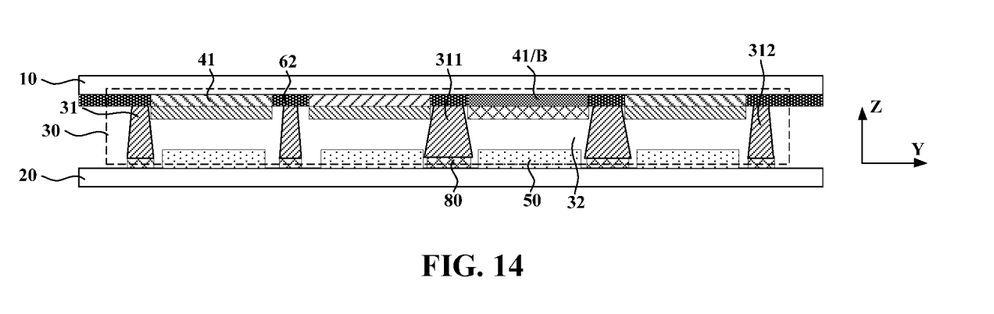
FIG. 14 is a schematic diagram of a display panel according to another embodiment of the present disclosure.

Referring to FIG. 14, FIG. 14 is a schematic diagram of a display panel according to another embodiment of the present disclosure. As shown in FIG. 14, in an embodiment, the display panel further includes black matrices 80 disposed on a side of the second substrate 20 facing the first substrate

10. The black matrices 80 define a plurality of light-transmitting openings corresponding to the bank openings 32. A projection of the bank layer 30 on the second substrate 20 covers projections of the black matrices 80 on the second substrate 20.

In this embodiment, the black matrices 80 are disposed on a side of the second substrate 20 facing the first substrate 10. In an embodiment, the black matrices 80 are disposed between the bank layer 30 and the second substrate 20. The black matrices 80 are able to block light. In this case, the laterally-leaked light of a light-emitting element are blocked by black matrices 80 when entering the gap between the bank structure 31 and the second substrate 20. This weakens the transmission of lateral light, reduces the crosstalk of lateral light leakage, and enhances the display effect.

Figure 15:
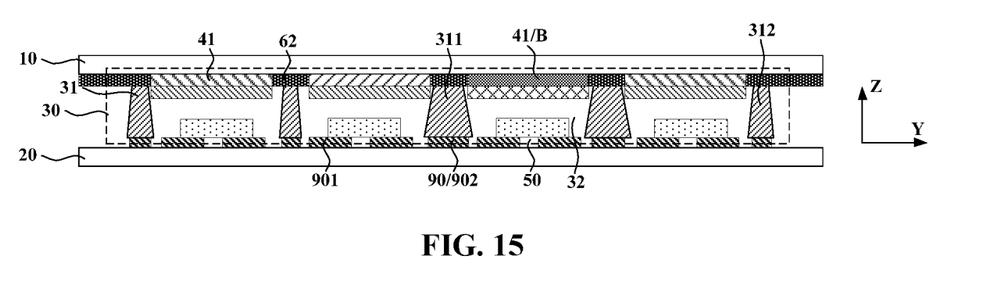
FIG. 15 is a schematic diagram of a display panel according to another embodiment of the present disclosure.

Referring to FIG. 15, FIG. 15 is a schematic diagram of a display panel according to another embodiment of the present disclosure. As shown in FIG. 15, in an embodiment, the display panel further includes a bonding layer 90 disposed on a side of the second substrate 20 facing the first substrate 10. The bonding layer 90 includes a plurality of first bonding structures 901 that are spaced apart. The light-emitting elements 50 are electrically connected to the first bonding structures 901. The bonding layer 90 further includes a plurality of second bonding structures 902 that are spaced apart; and the second bonding structure 902 is disposed at least between the second substrate 20 and a first bank structure 311.

In this embodiment, the bonding layer 90 is disposed between the second substrate 20 and the bank layer 30 and includes the first bonding structures 901; the light-emitting elements 50 are electrically connected to the second substrate 20 through the first bonding structures 901; the bonding layer 90 further includes the second bonding structures 902 that are spaced apart; and a second bonding structure 902 is disposed between the second substrate 20 and a first bank structure 311. The second bonding structures 902 are able to block light. In this case, the laterally-leaked light of a light-emitting element 50 are blocked by the second bonding structure 902 when entering the gap between the bank structure 31 and the second substrate 20. This weakens the transmission of lateral light, reduces the crosstalk of lateral light leakage, and enhances the display effect.

Figure 16:
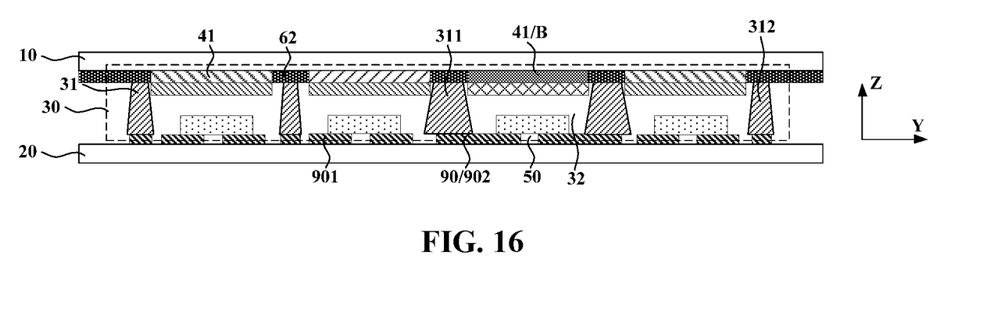
FIG. 16 is a schematic diagram of a display panel according to another embodiment of the present disclosure.

Referring to FIG. 16, FIG. 16 is a schematic diagram of a display panel according to another embodiment of the present disclosure. As shown in FIG. 16, optionally, a second bonding structure 902 disposed between the second substrate 10 and a first bank structure 311 extends to communicate with a first bonding structure 901 corresponding to the blue color resistance module B.

In this embodiment, a first bonding structure 901 corresponding to the blue color resistance module B extends to communicate with a second bonding structure 902 under an adjacent first bank structure 311 so as to further block laterally-leaked light and prevent the laterally-leaked light of a light-emitting element 50 from entering a gap between the bank structure 31 and the second substrate 20. This weakens the transmission of lateral light, reduces the crosstalk of lateral light leakage, and enhances the display effect.

Based on a same inventive concept, embodiments of the present disclosure further provide a display device. The display device includes the display panel described in any one of the preceding embodiments.

Figure 17:
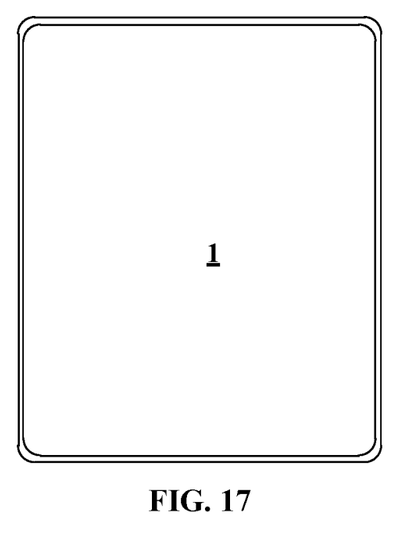
FIG. 17 is a schematic diagram of an electronic device according to an embodiment of the present disclosure.

The display device provided by this embodiment may be any electronic device, for example, a smartphone and a tablet. Referring to FIG. 17, FIG. 17 is a schematic diagram of an electronic device according to an embodiment of the present disclosure. As shown in FIG. 17, in an embodiment, the electronic device 1 may be a smartphone integrated with a display panel described in any one of the preceding embodiments.

In an embodiment, in the display panel of the display device, the bank structures are designed with different widths. A wide bank is more beneficial to absorbing photons of light and weakening the transmission of light. Moreover, since the width of a bank structure increases, the gap between the bank structure and the second substrate becomes a long slit, helping the bank structure absorb light. In an embodiment, the width of the first bank structure adjacent to a blue color resistance module is greater than the width of another second bank structure. In this case, the relatively great width of the first bank structure helps increase the propagation distance of laterally-leaked light transmitted between adjacent bank openings, thus weakening the laterally-leaked light emitted from an adjacent light-emitting element to enter the bank opening corresponding to the blue color resistance module. This reduces the risk of the crosstalk of leaked light and enhances the display effect.

It should be noted that the above are merely preferred embodiments of the present disclosure and technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display panel, comprising:
   a first substrate and a second substrate disposed opposite to each other;
   a bank layer disposed on a side of the first substrate facing the second substrate, wherein the bank layer comprises a plurality of bank structures, and the plurality of bank structures define a plurality of bank openings;
   a color resistance layer disposed on a side of the first substrate facing the second substrate, wherein the color resistance layer comprises a plurality of color resistance modules that are spaced apart, the plurality of color resistance modules are disposed in correspondence to the plurality of bank openings, and the plurality of color resistance modules comprise a blue color resistance module; and
   light-emitting elements, wherein light-emitting elements are disposed in correspondence to the plurality of bank openings, wherein a projection of light-emitting element on the first substrate does not overlap a projection of the bank structure on the first substrate,
   wherein the plurality of bank structures comprise a first bank structure and a second bank structure; in a direction parallel to the first substrate, the blue color resistance module is adjacent to at least one first bank structure; and a width of the first bank structure is greater than a width of the second bank structure.

2. The display panel of claim 1, wherein the plurality of color resistance modules further comprise a red color resistance module and a green color resistance module; and in the direction parallel to the first substrate, the second bank structure is disposed between the red color resistance module and the green color resistance module.

3. The display panel of claim 1, wherein in a direction perpendicular to the first substrate, the bank structure comprises a first end facing the first substrate and a second end facing the second substrate; and
in the direction parallel to the first substrate, a width of a first end of the first bank structure is greater than a width of a first end of the second bank structure, and a width of a second end of the first bank structure is greater than a width of a second end of the second bank structure.

4. The display panel of claim 1, further comprising a plurality of light-shielding structures disposed between the first substrate and the plurality of bank structures, wherein the plurality of light-shielding structures define a plurality of light-transmitting openings, and the plurality of light-transmitting openings are disposed in correspondence to the plurality of bank openings; and
wherein a projection of light-shielding structure on the first substrate overlaps at least part of a projection of the bank structure on the first substrate.

5. The display panel of claim 4, wherein the plurality of light-shielding structures comprise a first light-shielding structure and a second light-shielding structure;
in a direction perpendicular to the first substrate, the first light-shielding structure overlaps at least part of the first bank structure, and the second light-shielding structure overlaps at least part of the second bank structure; and
in the direction parallel to the first substrate, a width of the first light-shielding structure is greater than or equal to a width of the second light-shielding structure.

6. The display panel of claim 5, wherein a projection of the first light-shielding structure on the first substrate overlaps a projection of the first bank structure on the first substrate, and a projection of the second light-shielding structure on the first substrate overlaps a projection of the second bank structure on the first substrate.

7. The display panel of claim 5, wherein in an extension direction of the plurality of bank structures, the second light-shielding structure is symmetrical with respect to a first symmetrical benchmark, and the second bank structure is symmetrical with respect to a second symmetrical benchmark; and
in the direction parallel to the first substrate, a preset distance is provided between the first symmetrical benchmark and the second symmetrical benchmark.

8. The display panel of claim 7, wherein the plurality of color resistance modules further comprise a red color resistance module and a green color resistance module; and
in the direction parallel to the first substrate, the second bank structure is disposed between the red color resistance module and the green color resistance module; and the second symmetrical benchmark of the second bank structure is farther away from the red color resistance module than the first symmetrical benchmark of a second light-shielding structure corresponding to the second bank structure.

9. The display panel of claim 8, wherein light-emitting element comprises a first electrode, a second electrode, and a light-emitting structure body electrically connected to the first electrode and the second electrode;
in the direction perpendicular to the first substrate, light-emitting structure body comprises a first surface facing the first substrate; and in the direction parallel to the first substrate, an area of a first surface of a light-emitting structure body corresponding to the red color resistance module is larger than an area of a first surface of a light-emitting structure body corresponding to the green color resistance module; or an area of a first surface of a light-emitting structure body corresponding to the red color resistance module is larger than an area of a first surface of a light-emitting structure body corresponding to the blue color resistance module.

10. The display panel of claim 1, further comprising a first functional layer disposed on a side of the color resistance layer facing the second substrate, wherein the first functional layer comprises a plurality of functional modules that are spaced apart, the plurality of functional modules are disposed in correspondence to the plurality of bank openings, and the functional module is made of scattered ions; and
in the direction parallel to the first substrate, the bank structure is disposed in a gap between two adjacent functional modules.

11. The display panel of claim 10, wherein the plurality of functional modules comprise a first functional module and a second functional module;
the plurality of color resistance modules further comprise a red color resistance module and a green color resistance module;
the blue color resistance module is disposed in correspondence to the first functional module, and the second functional module is disposed in correspondence to the red color resistance module or the green color resistance module; and
the second functional module is further made of quantum dots.

12. The display panel of claim 1, comprising a display region and a non-display region, wherein the display region comprises a plurality of first display units disposed in an array,
the first display unit comprises three light-emitting elements disposed sequentially in a first direction and each disposed in correspondence to a color resistance module of a different color.

13. The display panel of claim 1, comprising a display region and a non-display region, wherein the display region comprises a plurality of second display units disposed in an array, wherein
the second display unit comprises three light-emitting elements each disposed in correspondence to a color resistance module of a different color; and
in the second display unit, two light-emitting elements of the three light-emitting elements are disposed in a same row, and a remaining light-emitting element of the three light-emitting elements is disposed in an adjacent row.

14. The display panel of claim 1, wherein at least part of the first bank structure is made of a light-absorbing material.

15. The display panel of claim 1, wherein the bank structure comprises a second end facing the second substrate; and
the display panel further comprises at least one light-absorbing module, and light-absorbing module covers at least a second end of the first bank structure.

16. The display panel of claim 15, wherein a projection of light-absorbing module on the first substrate covers a projection of the bank structure on the first substrate.

17. The display panel of claim 1, further comprising black matrices disposed on a side of the second substrate facing the first substrate, wherein the black matrices define a plurality of light-transmitting openings, the plurality of light-transmitting openings are disposed in correspondence to the plurality of bank openings, and a projection of the bank layer on the second substrate covers projections of the black matrices on the second substrate.

18. The display panel of claim 1, wherein
the display panel further comprises a bonding layer disposed on a side of the second substrate facing the first substrate, the bonding layer comprises a plurality of first bonding structures that are spaced apart, and light-emitting elements are electrically connected to the plurality of first bonding structures; and
the bonding layer further comprises a plurality of second bonding structures that are spaced apart, and the second bonding structure is disposed between the second substrate and the first bank structure.

19. The display panel of claim 18, wherein the second bonding structure disposed between the second substrate and the first bank structure extends to communicate with a first bonding structure corresponding to the blue color resistance module.

20. A display device, comprising a display panel comprising:
a first substrate and a second substrate disposed opposite to each other;
a bank layer disposed on a side of the first substrate facing the second substrate, wherein the bank layer comprises a plurality of bank structures, and the plurality of bank structures define a plurality of bank openings;
a color resistance layer disposed on a side of the first substrate facing the second substrate, wherein the color resistance layer comprises a plurality of color resistance modules that are spaced apart, the plurality of color resistance modules are disposed in correspondence to the plurality of bank openings, and the plurality of color resistance modules comprise a blue color resistance module; and
light-emitting elements, wherein light-emitting elements are disposed in correspondence to the plurality of bank openings, wherein a projection of light-emitting element on the first substrate does not overlap a projection of the bank structure on the first substrate,
wherein the plurality of bank structures comprise a first bank structure and a second bank structure; in a direction parallel to the first substrate, the blue color resistance module is adjacent to at least one first bank structure; and a width of the first bank structure is greater than a width of the second bank structure.

* * * * *